(12) United States Patent
Chang et al.

(10) Patent No.: US 6,232,802 B1
(45) Date of Patent: May 15, 2001

(54) SELECTIVE SAMPLED PEAK DETECTOR AND METHOD

(75) Inventors: Menping Chang, Cupertino; Hai T. Nguyen, San Jose, both of CA (US)

(73) Assignee: Kendin Communications, Inc., Sunnyvale, CA (US)

( * ) Notice: Subject to any disclaimer, the term of this patent is extended or adjusted under 35 U.S.C. 154(b) by 0 days.

(21) Appl. No.: 09/321,938

(22) Filed: May 28, 1999

(51) Int. Cl.[7] .................................................... G01R 19/00
(52) U.S. Cl. ............................................. 327/59; 327/58
(58) Field of Search ............................... 327/58, 59, 62, 327/72, 73, 95, 96, 91, 94, 363

(56) References Cited

U.S. PATENT DOCUMENTS

| | | | |
|---|---|---|---|
| 3,699,357 | * 10/1972 | Lloyd | 327/59 |
| 4,053,799 | * 10/1977 | Minami | 327/59 |
| 4,866,301 | * 9/1989 | Smith | 327/58 |
| 5,267,269 | 11/1993 | Shih et al. | 375/60 |
| 5,428,307 | * 6/1995 | Dendinger | 327/62 |
| 5,546,027 | * 8/1996 | Shinozaki et al. | 327/59 |

OTHER PUBLICATIONS

Johnson, Mark G, et al. "A Variable Delay Line PLL for CPU—Coprocessor Synchronization" Oct. 1988, pp. 1218–1223, *IEEE Journal of Solid–State Circuits*, vol. 23 No. 5.

Sonntag, Jeff, et al. "A Monolithic CMOS 10 MHz DPLL for Burst–Mode Data Retiming", Feb. 16, 1990, pp. 194–195 and 294, *1990 IEEE International Solid–State Circuits Conference Digest of Technical Papers*, 37th ISSCC, First Edition.

Everitt, James, et al., "A CMOS Transceiver for 10–Mb/s and 100–Mb/s Ethernet", Dec. 1998, pp. 2169–2177, *IEEE Journal of Solid–State Circuits*, vol. 33, No. 12.

\* cited by examiner

*Primary Examiner*—Toan Tran
(74) *Attorney, Agent, or Firm*—Fenwick & West LLP

(57) ABSTRACT

An apparatus for tracking a peak level of an input signal includes a comparator for comparing the peak level of the input signal with a reference peak voltage signal. A sample and block circuit is coupled to the output of the comparator and is capable of sampling a portion of the input signal. The sampled portion of the input signal is defined by a smart window (timing window) which is received by the sample and block circuit. The sample and block circuit controls a charge pump that determines the level of the reference peak voltage signal. A method of generating a reference peak voltage signal includes receiving an input data, generating a timing window based upon the input data to define a sampling portion in the input data, comparing a level of the reference peak voltage signal with a level of the sampling portion in the input data, and determining a level of the reference peak voltage signal based upon the comparing step.

8 Claims, 8 Drawing Sheets

Noise Has No Effect Outside The Window

Noise Inside The window Has Only Controlled Effect (dVo)

$$dVo = \frac{Iout}{C} \cdot \Delta t$$

Timing Window Generator

SELECTIVE SAMPLED PEAK DETECTOR AND METHOD

FIELD OF THE INVENTION

The present invention relates generally to the field of peak detection, and more particularly to a peak detector that samples selected portions of an input data signal.

BACKGROUND OF THE INVENTION

Peak detection techniques are required in various applications that require the information of the signal strength or power level. For example, in physical layer designs, particularly in designs with 100 Base TX receivers, peak detection plays an important role in the process of recovering data that has propagated across a medium such as a CAT-5 cable. In some architectures, an average peak voltage level of an input signal is used to determine the length of the cable, and is also used to define the level of equalization required to compensate for amplitude loss and phase distortion incurred by the signal after transmitting along the cable line. The design of peak detectors with good noise immunity becomes more important for systems with smaller incoming signal levels (due to, for example, long cable lengths and/or reduced supply voltage ranges), and for systems with a higher level of chip integration (analog and digital).

FIG. 1A illustrates a block diagram of a conventional peak detector 100 which includes a comparator 105, charge pump 110, and a capacitor 115. The output of the comparator 105 is coupled to charge pump 110 including a controlled pull-up current source 112 for generating current $I_1$, a controlled pull-down current source 114 for generating current $I_2$. The output of the charge pump 110 is coupled to the capacitor 115 as well as the negative input terminal "−" of the comparator 105, thus forming a unity gain feedback configuration.

The charge pump 110 and the capacitor 115 generate an average peak voltage signal $V_0$ across capacitor 115. To detect the peak voltage signal for positive pulses in a data signal, the pull-up current source 112 is much greater than the pull-down current source 114 (i.e., $I_1 \gg I_2$). On the other hand, for negative pulses in a data signal, the pull-down current source 114 is much greater than the pull-up current source 112 (i.e., $I_1 \ll I_2$). As depicted by FIG. 1B, the principle of this conventional peak detector 100 is as follows. The positive pulses peak detection is used as an example. After the average peak level $V_0$ is achieved, the total area of data signal 150 which is above the level $V_0$ is denoted as $A_1$. The total area of data signal 150 which is below the level $V_0$ is denoted as $A_2$. The average peak level $V_0$ is derived to include $A_1$ ( x )=$A_2$, wherein x=$I_1/I_2$. The ratio of the pump up current $I_1$ over the pump down current $I_2$ (or x) is much great than one (1). Similarly, for a negative pulses peak detection, the following is satisfied: $A_1=A_2$ ( x ), wherein x=$I_2/I_1$. The ratio of the pump down current $I_2$ over the pump up current $I_1$ (or x) is much great than one (1).

Conventional peak detectors suffer from various problems and drawbacks such as, for example, data dependency, high sensitivity to noise, and level fluctuation, as discussed below. The data dependent nature of conventional peak detectors is shown in the example of FIG. 1B. Assume that an input data signal 150 is received at the positive input terminal "+" of the comparator 105. Since the data input signal 150 has a dense pulse pattern (i.e., logic high occurs more frequently than logic low), the level of the average peak voltage signal $V_0$ will be close to the peak level 155 of the input data signal 150 pulses. In contrast, for a data input signal 160 with a sparse pulse pattern (i.e., logic low occurs more frequently than logic high), the level of the average peak voltage signal $V_0$ is significantly less than the peak level 165 of the input data signal 160 pulses. The average peak voltage signal $V_0$ tends to drift downward toward the logic low level due to the sparse pulse pattern, and, as a result, may not provide a correct measurement of the peak level 165 of the input data signal 160. To reduce the data-dependent nature of conventional peak detectors, the current ratio provided by current sources 112 and 114 (FIG. 1A) must be adjusted. For example, to detect the peak of positive pulses in a data signal, the ratio of the pull-up current source 112 over its pull-down current source 114 is set at a much higher value (i.e., x=$I_1/I_2 \gg 1$). Thus, even if a sparse pulse pattern signal occurs, the average peak voltage signal $V_0$ will quickly pull-up to the pulse peak in the data signal.

However, the much higher ratio between the current sources 112 and 114 causes a conventional peak detector to be more sensitive to noise induced at the peak detector input. For example, in FIG. 1C noise 170 may occur at a pulse peak of an input data signal 175. The average peak voltage signal $V_0$ will quickly rise to at least the noise 170 level. Since the charge rate of current source 112 is much higher than the discharge rate of current source 114, the average peak voltage signal $V_0$ requires significant time before decreasing to the correct pulse peak level 180. This characteristic makes the average peak voltage signal $V_0$ very sensitive to the induced noise.

Conventional peak detectors also suffer from a level fluctuation problem that occurs when the peak detector tries to overcome a change in the pulse peak level, as described below with reference to FIGS. 1D and 1E. Conventional peak detectors typically use a drooping mechanism for tracking pulses as the pulses gradually decrease in amplitude. In the case of detecting the peak of a positive pulse, the droop rate is controlled by pull-down current 114 and the capacitor 115. An average peak voltage signal $V_0$ generated by a conventional peak detector may "droop" so that the decreasing peak levels 180 of an input data signal 185 are properly tracked. FIG. 1D illustrates how this drooping condition permits the tracking of the decreasing peak amplitude. However, FIG. 1E illustrates the drawback caused by the drooping condition of the average peak voltage signal $V_0$. The average peak voltage signal $V_0$ will fluctuate if the peak amplitude of the pulse 185 does not decrease its level in a subsequent pulse. In particular, the average peak voltage signal $V_0$ will droop between pulse occurrences and then suddenly increase by an amount 190 to the peak level 180 during a subsequent pulse occurrence. This condition results in an undesired signal fluctuation.

Therefore, there is a need for an improved peak detector that overcomes the problems of data dependency, high sensitivity to noise, and undesired level fluctuation.

SUMMARY OF THE INVENTION

The apparatus and method of the present invention operates to track a peak level of an input signal. The apparatus includes a comparator for comparing the peak level of the input signal with a reference peak voltage signal. A sample and block circuit is coupled to the output of the comparator and is capable of sampling a portion of the input signal. The sampled portion of the input signal is defined by a smart window (timing window) which is received by the sample and block circuit. The sample and block circuit controls a charge pump that adjusts the level of the reference peak voltage signal.

The use of a "smart window" in accordance with the present invention provides a peak detector that has a high immunity to noise. In addition, the use of a "smart widow" reduces the level of fluctuation in the reference peak voltage signal generated by the peak detector. Furthermore, the present invention provides a peak detector with an improved peak detection performance that is not negatively affected by the pulse pattern of the input signal.

The apparatus and method of the present invention is useful in many applications that require signal peak detection. Thus, the present invention can improve the performance of transceivers, sensors, cellular phones transmit output level control and many other devices.

DETAILED DESCRIPTION OF THE PREFERRED EMBODIMENTS

Figure 1A:
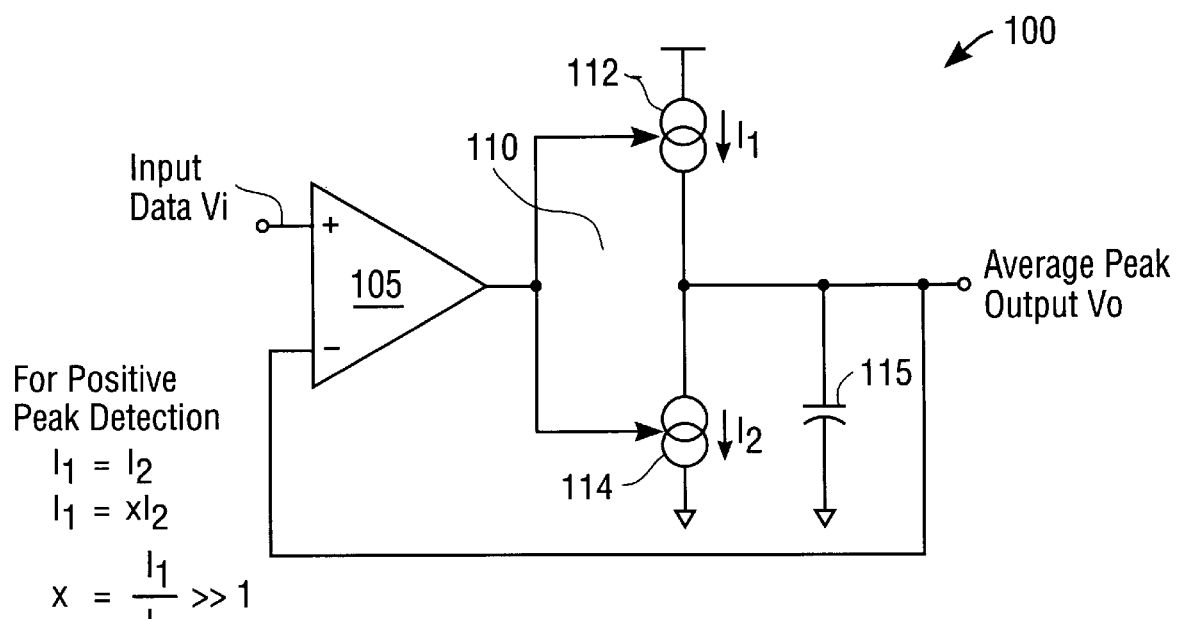
FIG. 1A is a schematic block diagram of a conventional peak detector.
Figure 1B:
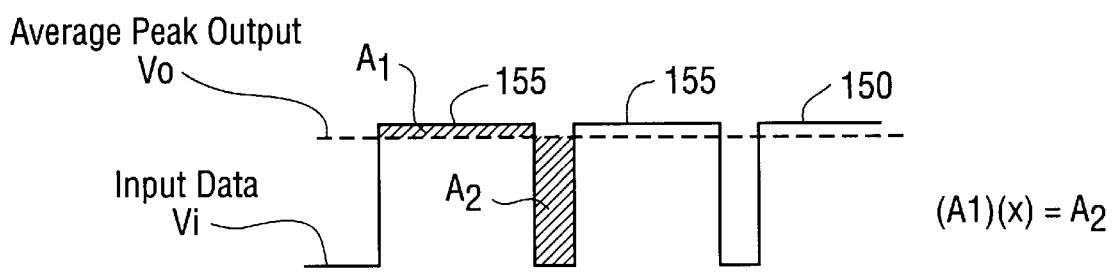
FIG. 1B is a waveform diagram of the peak detector in FIG. 1A, wherein the waveform diagram also illustrates the pulse density dependency issue.
Figure 1B:
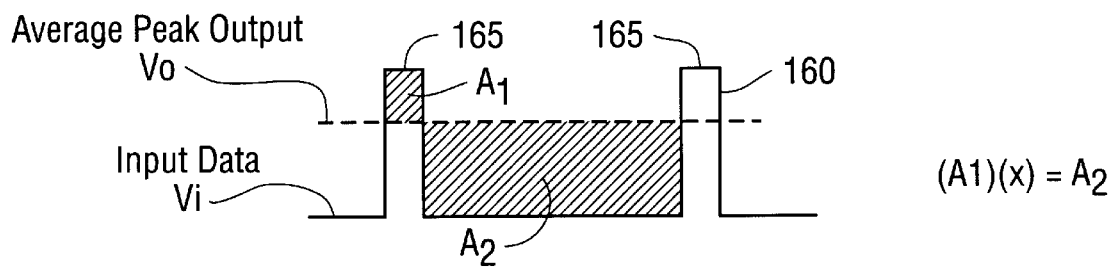
Figure 1C:
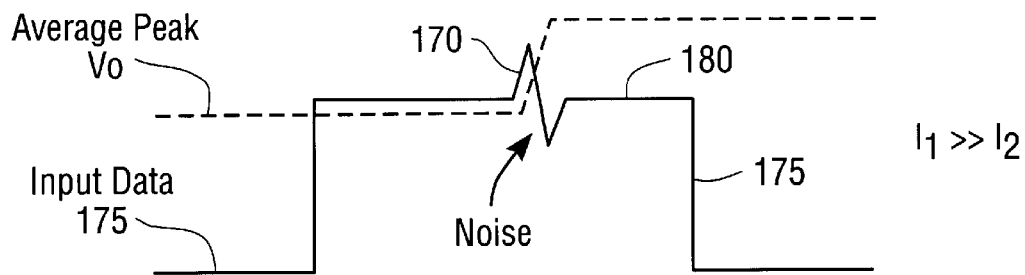
FIG. 1C is a waveform diagram of a data signal with noise.
Figure 1D:
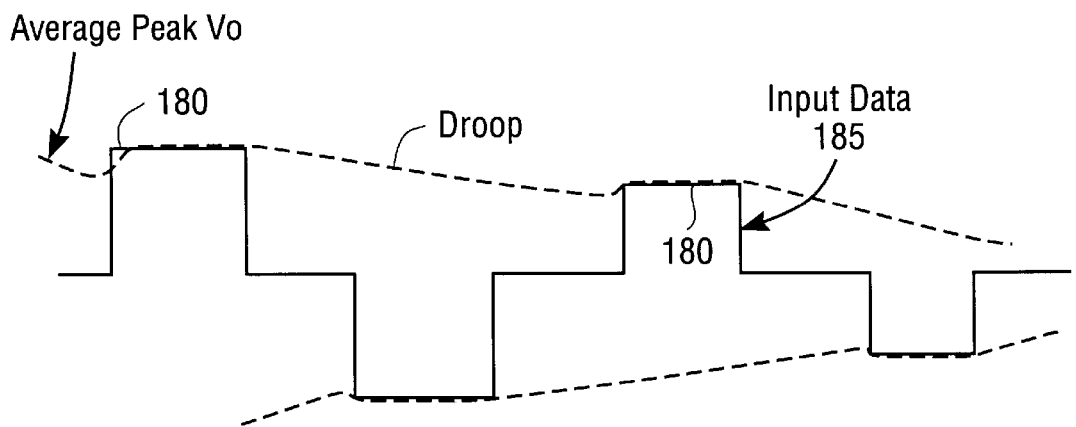
FIG. 1D is a waveform diagram illustrating a drooping condition for facilitating the peak detection of pulses with decreasing amplitude.
Figure 1E:
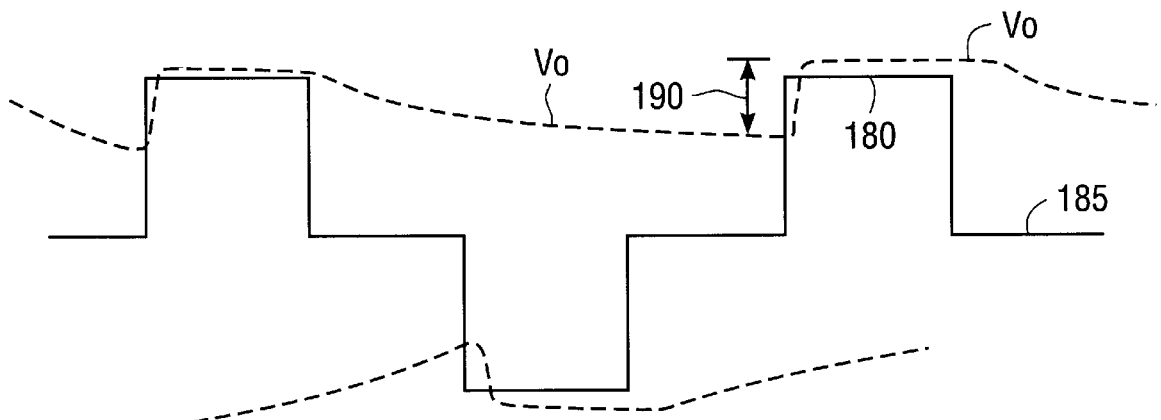
FIG. 1E is a waveform diagram illustrating the drooping condition that causes a reference peak level signal from a conventional peak detector to fluctuate for pulses with constant amplitude.
Figure 2:
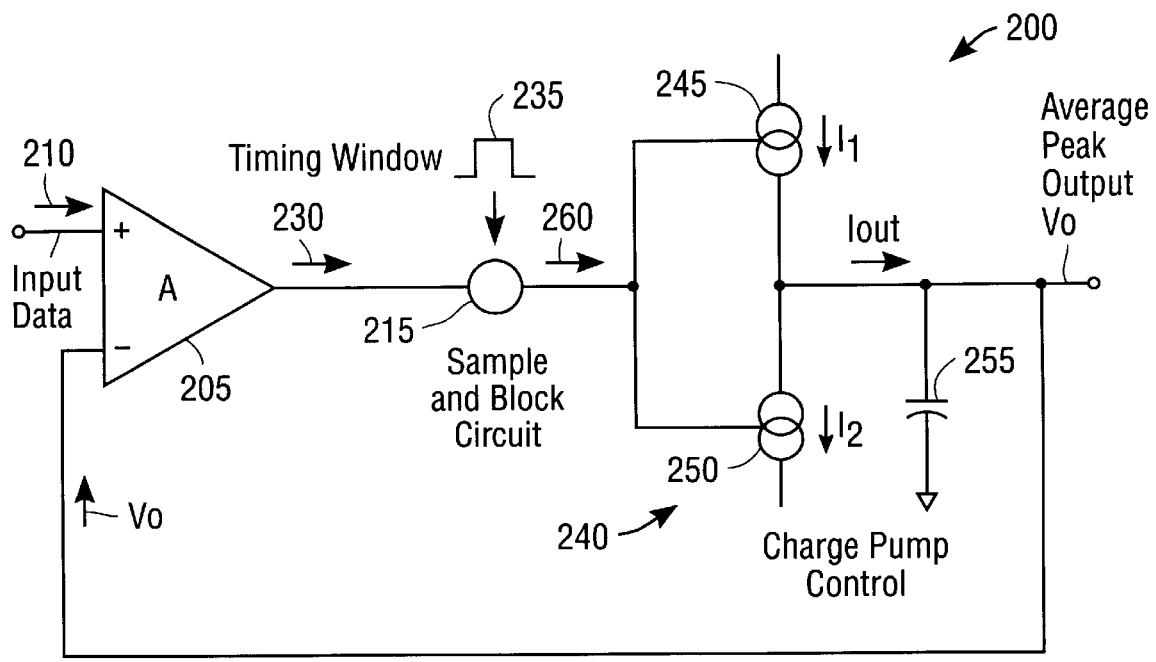
FIG. 2 is a schematic block diagram of a selective sampled peak detector in accordance with an embodiment of the present invention.

FIG. 2 is a schematic block diagram of a selective sampled peak detector 200 in accordance with an embodiment of the present invention. The peak detector 200 includes a comparator 205 for comparing an input data signal 210 with an average peak voltage output signal (reference peak voltage signal) $V_O$ that is generated at the peak detector 200 output. The comparator 205 generates a comparing value signal 230 based upon the comparison of the input data signal 210 and the average peak voltage signal $V_O$. A sample and block circuit 215 permits the sampling of a comparing value signal 230 by use of smart windows (timing windows) 235, as described below in further details.

A charge pump 240 receives the output of the sample and block circuit 215 to control a pull-up current source 245 for generating current $I_1$, and a pull-down current source 250 for generating current $I_2$. The voltage across an output capacitor 255 is the average peak voltage signal $V_O$ and is determined by $I_{out}$. If the charge pump 240 is pumping up, then $I_{out}=I_1$. If the charge pump is pumping down, then $I_{out}=-I_2$. Outside of a smart window 235 (FIG. 2), both current sources 245 and 250 are off so that $I_{out}=0$. To track the peak of positive pulses in a data signal 210, $I_1=x(I_2)$, wherein x ranges from approximately 2 to 4. Similarly to track the negative pulses in data signal 210, $I_2=x(I_1)$.

The present invention incorporates a sample and block scheme that is controlled by a smart window, thereby leading to a number of advantages, such as improved noise immunity, reduced signal fluctuation and no data dependency. The above-mentioned scheme, therefore, provides an improved control mechanism for turning on and off the charge pump 240 which determines the average peak voltage signal $V_O$. The charge pump currents $I_1$ and $I_2$ may be individually set for optimized result. Since the present invention uses a smart "sample" scheme to replace the blindly "droop" scheme of conventional approaches to catch a decreasing peak level of a signal, the problem due to the effect of drooping is totally eliminated.

Figure 3A:
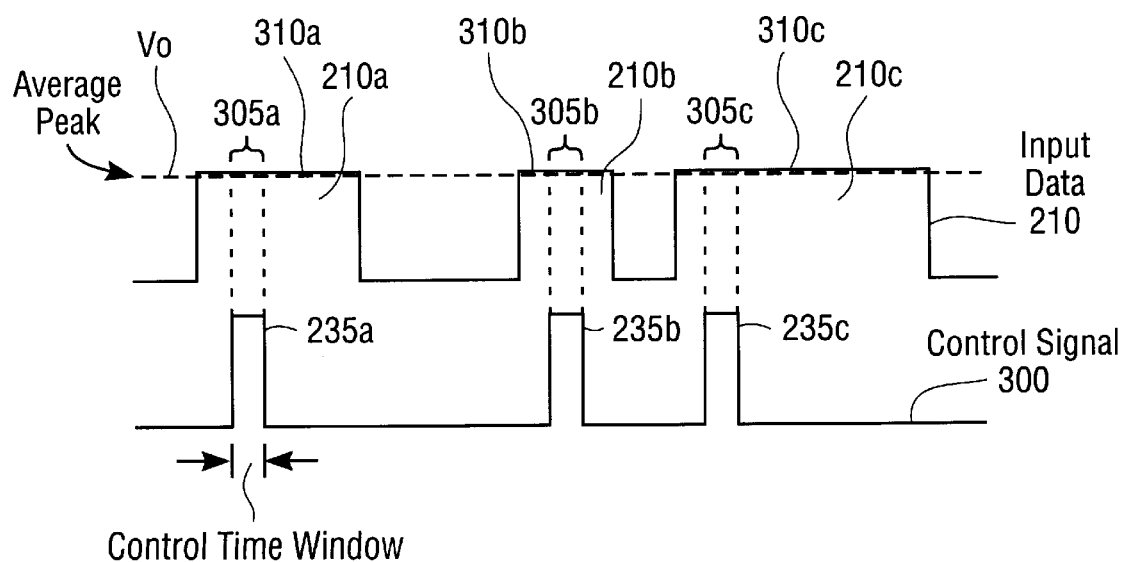
FIG. 3A is a waveform diagram illustrating the use of smart windows for sampling portions of an input data signal.
Figure 6:
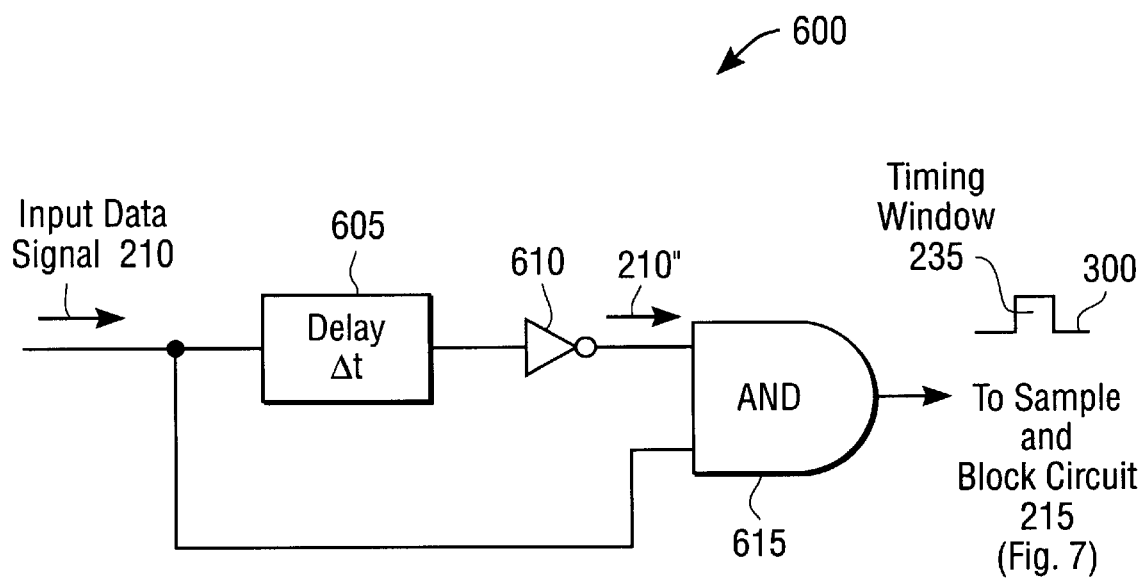
FIG. 6 is a schematic block diagram of an embodiment of a circuit for generating and controlling the smart windows.

Reference is now made to FIGS. 2 and 3A to describe the operation of the peak detector 200. The peak information of pulses in the input data signal 210 is sampled within time intervals defined by the smart windows 235. These time intervals may vary as programmed by the user and as dictated by the application in which the peak detector 200 is used. The smart windows 235 are defined by a control signal which may be generated by, for example, a block circuit 600 as shown in FIG. 6 and as described below in additional details. Each smart window 235 selects a portion of an input data signal 210 to generate the sampling window, and the sample operation is applied to signal 230. Each of the smart windows skips the other portions of the input signal 210 that contains no peak information. Thus, in the example shown in FIG. 3A, the smart windows 235a, 235b, and 235c select the peak portions 305a, 305b, and 305c, respectively. The peak portions 305a, 305b, and 305c provide the correct peak information for the pulses 210a, 210b, and 210c, respectively. The portions of input data signal 210 that are outside the boundaries defined by the smart windows 235a–235c are not sampled and are not considered during the determination of the average peak voltage signal $V_O$.

The comparator 205 and sample window 235 together achieve the desired operation. The comparator 205 output controlled by sample circuit 215 is only valid to charge pump during the selected peak portion of the in-coming signal. The comparator 230 compares the incoming peak level versus the peak information ($V_O$) stored in the capacitor 255. Comparator output 230 goes high if the incoming peak is higher than the stored peak $V_O$. The sample circuit 215 passes signal 230 to signal 260, which turns on pull-up current source 245 ($I_{out}=I_1$) to increase the level of stored peak $V_O$. Comparator output 230 goes low if the incoming peak is lower than the stored peak $V_O$. The sample circuit 215 passes signal 230 to signal 260, which turns on pull-down current source 250 ($I_{out}=-I_2$) to decrease the level of stored peak $V_O$. Outside the sample window, the comparator output 230 is blocked from signal 260 (i.e., $I_{out}=0$). The incoming signal level has no effect on the stored peak $V_O$.

Peak Detection Of A Signal With Sparse Pulse Pattern

Figure 3B:
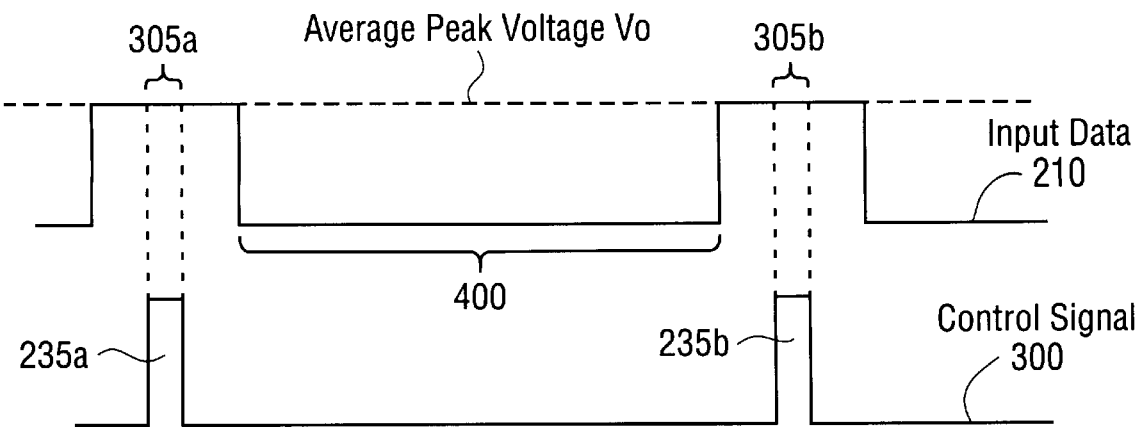
FIG. 3B is a waveform diagram illustrating the use of smart windows for sampling portions of an input data signal with a sparse pulse pattern.

Reference is now made to FIG. 3B to discuss the operation of the peak detector 200 to track the peak level of an input data signal 210 with a sparse pulse pattern. The smart windows 235a and 235b select the peak portions 305a and 305b, respectively, for sampling. The net outcome is that only the peak portions 305a and 305b are passed by the sample and block circuit 215 (FIG. 2) for controlling the charge pump 240 output. The low logic level interval 400 is not sampled, and as a result, the sample and block circuit 215 will not cause the charge pump 240 to pump down the average peak voltage signal $V_O$ during interval 400. Thus, the peak detector 200 avoids the droop and undesired fluctuations of the average peak voltage signal $V_O$ during the occurrence of a sparse pulse pattern.

High Immunity To Noise

The peak detector in accordance with the present invention has a high immunity to noises in the input data signals. This is because in the charge pump 240, the ratio $I_1/I_2$ is low. By use of the sample and block scheme of the present invention, there is no pattern dependency issue of the conventional approach and, therefore, the condition, $I_1 \gg I_2$, is not required. Since the pump up current $I_1$ is reduced, the change of voltage of the average peak voltage signal $V_O$ per pump is also reduced. This results in an improved noise immunity feature for the present invention. The rate of change of the average peak voltage signal $V_O$ ($dV_O/dt$) is defined in equation (1).

$$dV_O/dt = I_{out}/C \qquad (1)$$

The term $dV_O$ is the variation of the average peak voltage signal $V_O$, while the term dt is defined as the sampled period during each occurrence of a smart window 235. The current values $I_{out}$ are generated by the current sources 245 and 250, while C is a constant capacitive value of the output capacitor 255.

Figure 4A:
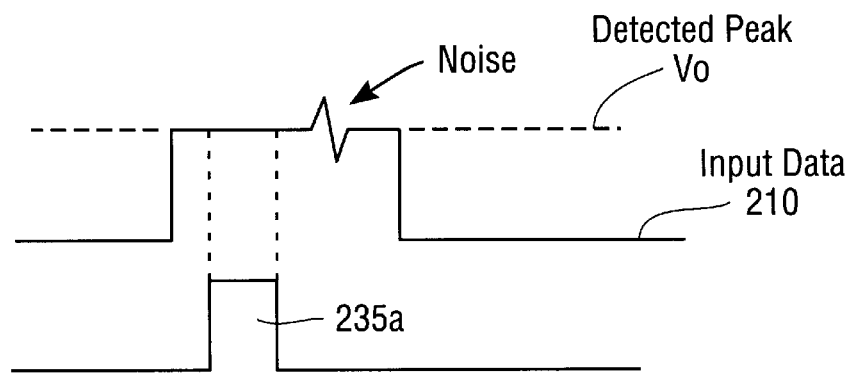
FIG. 4A is a waveform diagram which shows that noise has no effect outside of a smart window interval.
Figure 4B:
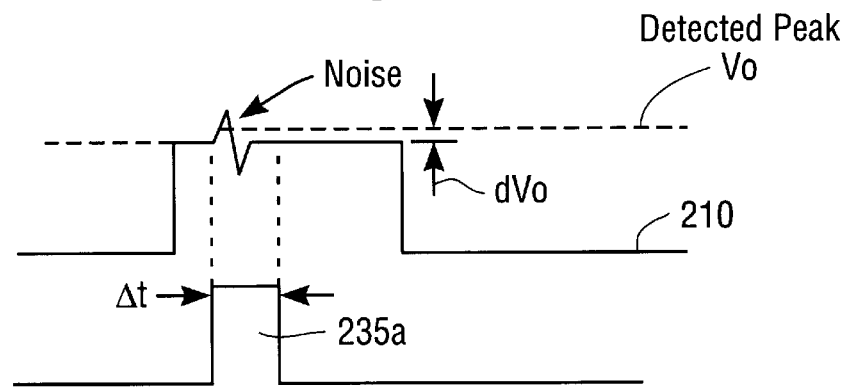
FIG. 4B is a waveform diagram which shows that noise has only a controlled effect within a smart window interval.

As stated above, the ratio of the pull-up current source 245 and the pull-down current source 250 is small. As a result, the value of $I_{out}$ is also small. Since the value of $I_{out}$ is small, the value of $dV_O/dt$ is also small. Therefore, the variation of the average peak voltage signal ($dV_O$) is also small during every sampled period dt. In other words, noise which occur during the sampling period dt will only cause a small or insignificant change in the average peak voltage signal $V_O$. Additionally, noises that occur outside the smart windows 235 are not sampled and will therefore not be stored in the charge pump 240 (FIG. 2). As a result, noises that occur outside the smart windows 235 do not affect the value of the average peak voltage signal $V_O$. FIG. 4A shows that noise has no effect on the average peak voltage signal $V_O$ outside of a timing window 235a, while FIG. 4B shows that noise occurring inside of a window 235a interval has only a controlled effect (or negligible effect) of $dV_O$, as discussed above. Thus, the present invention overcomes the noise sensitivity problem of the conventional peak detectors.

It is further noted that under a noisy environment the values of $I_{out}$ and C, and dt in equation (1) may be programmed or set at known values. Thus, the value of the variation of the peak voltage signal ($dV_O$) may be controlled, thereby resulting in a better controlled peak detector that has a high immunity to noise.

Thus, a peak detector in accordance with the present invention does not depend on the data pattern and is not constrained by a large ratio between the current source 245 and 250, and has the flexibility to optimize current sources 245 and 250 for optimizing performance. The peak detector has a substantially improved noise immunity performance. As a result, the average peak voltage signal $V_O$ provides an accurate measurement of a pulse peak level of a data signal, even if the data signal has a sparse pulse pattern or noises.

Window Generation

Figure 5A:
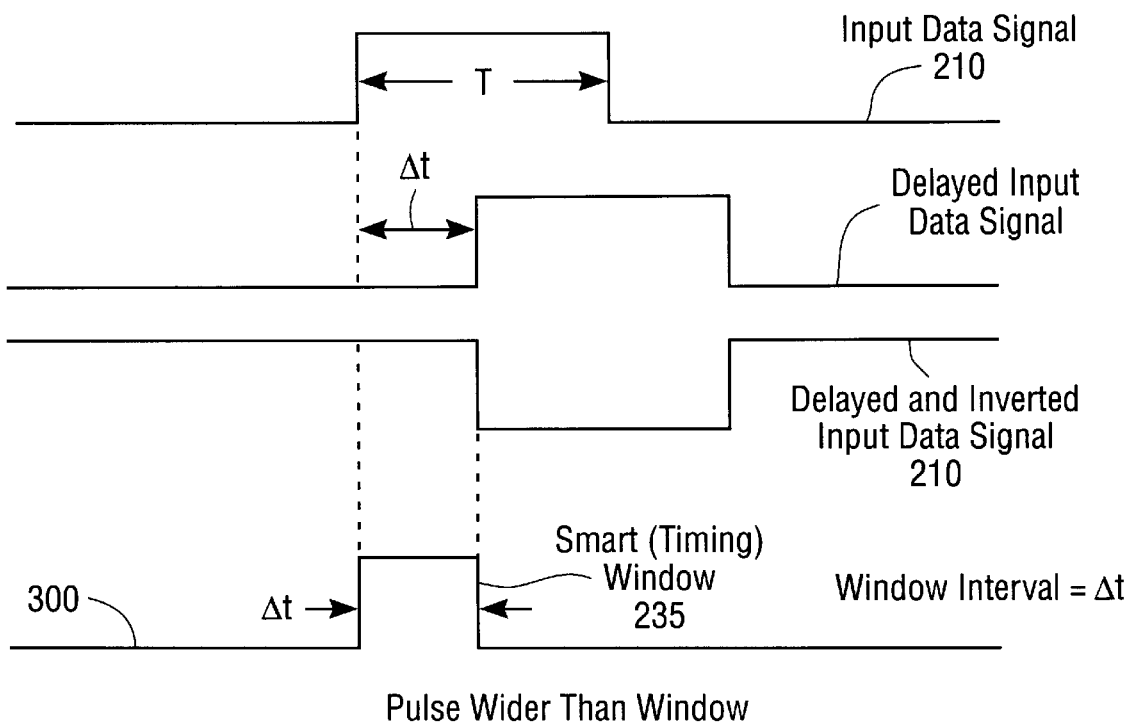
FIGS. 5A and 5B illustrate waveform diagrams for describing a method of generating a smart window in accordance with the present invention.
Figure 5B:
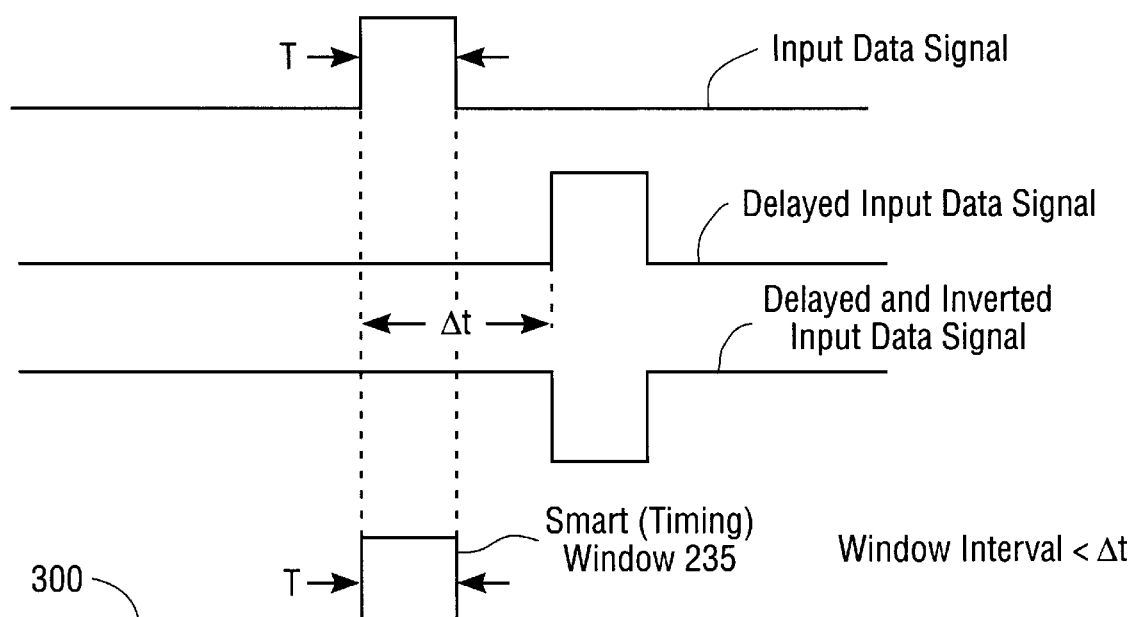

Reference is now made to the waveform diagrams in FIGS. 5A and 5B and the timing window generator 600 in FIG. 6 to describe the generation of smart windows 235 in accordance with the present invention. To generate such a window 235, the input data signal 210 is delayed by delay stage 605 by time Δt and inverted by inverter 610 into an inverted/delayed signal 210". The input data signal 210 and inverted/delayed signal 210" are ANDed by AND gate 615 to generate the control signal 300 with a smart window 235. If a pulse width T of the input signal 210 is greater than the delay time Δt, then the smart window 235 will have a width of Δt. On the other hand, if a pulse width T of the input signal is less than the delay time Δt, then the width of the smart window 235 will be T, as shown in FIG. 5B.

It is noted that other embodiments and configurations may be used to implement the circuit 600 for generating and controlling a smart window, depending on the application of the invention. For example, the implementation of circuit 600 may be varied, for example, to select a specific portion and/or pattern of pulses that is more meaningful for the applications.

Figure 7:
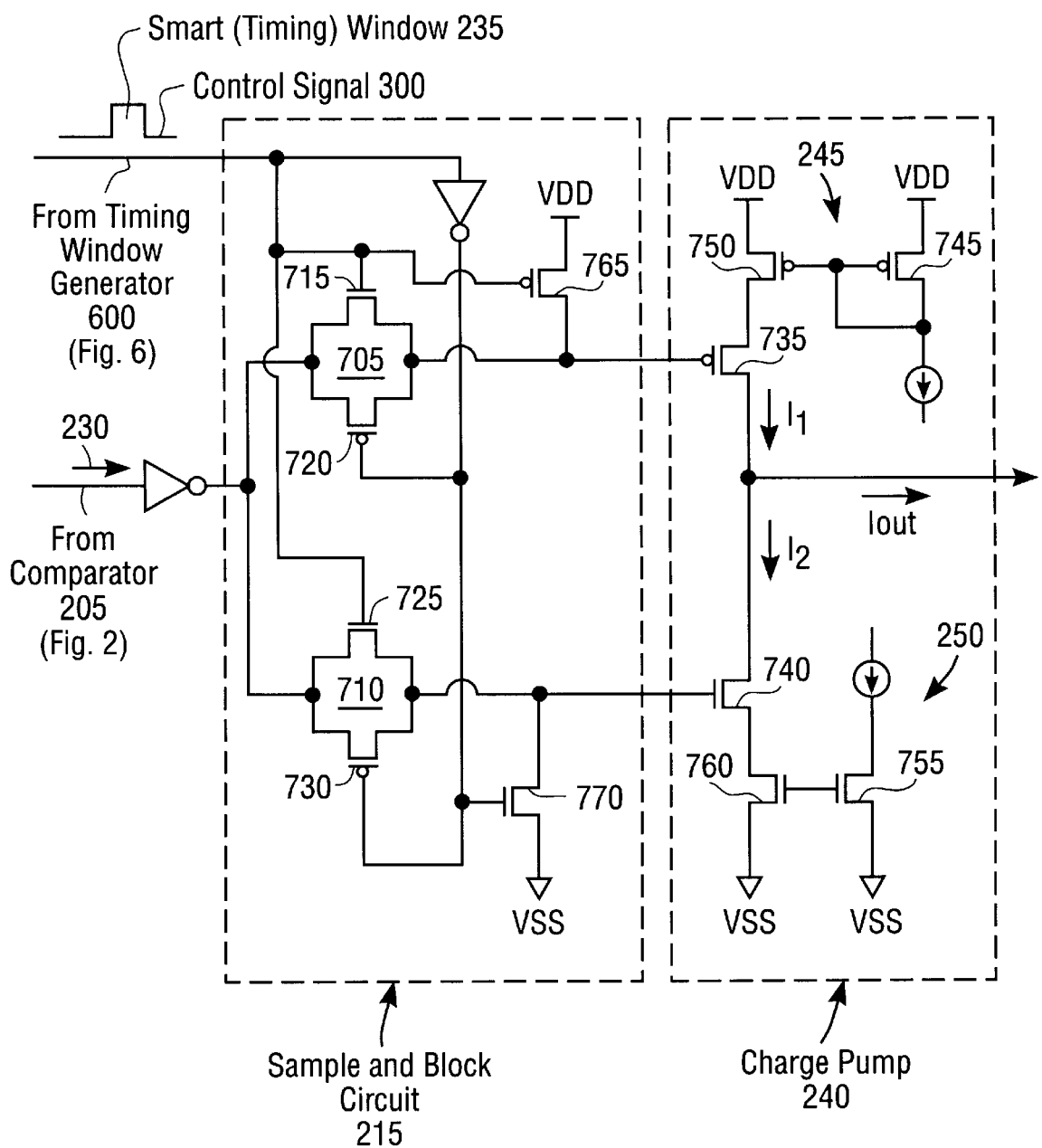
FIG. 7 is a schematic block diagram of an embodiment of a sample and block circuit coupled to a charge pump.

FIG. 7 is a schematic block diagram of an embodiment of a sample and block circuit 215 that is integrated with charge pump 240. It is noted that other embodiments and configurations of the sample and block circuit 215 may be implemented depending on the application of the invention. In the embodiment shown in FIG. 7, the smart window 235 of control signal 300 controls a pair of transmission gates 705 and 710. The gate 705 includes n-channel transistor 715 and p-channel transistor 720, while the gate 710 includes n-channel transistor 725 and p-channel transistor 730. When the control signal 300 is high (i.e., a smart window 235 is high or asserted), the comparing value signal 230 (from comparator 205 in FIG. 2) is passed to pump control transistors 735 and 740. Thus, if the comparing value signal 230 is high, then the pump control transistor 735 is on and the pump control transistor 740 is off, thereby permitting the charge pump 230 to pump up. If the comparing value signal 230 is low, then the pump control transistor 735 is off and the pump control transistor 740 is on, thereby permitting the charge pump 240 to pump down. The pump-up current value $I_1$ is set by the fixed current source 245 including a current mirror formed by transistors 745 and 750. The pump-down current value $I_2$ is set by the fixed current source 250 including a current mirror formed by transistors 755 and 760.

When the control signal 300 is low (i.e., a smart window 235 is not present), both transmission gates 705 and 710 are off. The p-channel transistor 765 is on and will pull the gate of pump control transistor 735 high, thereby turning off transistor 735. The n-channel transistor 770 is on and pulls the gate of pump control transistor 740 low, thereby turning off the transistor 740. Since the pump control transistors 735 and 740 are off, the value of $I_{out}$ is zero and the value of $V_O$ remains the same.

Operation Summary

Figure 8:
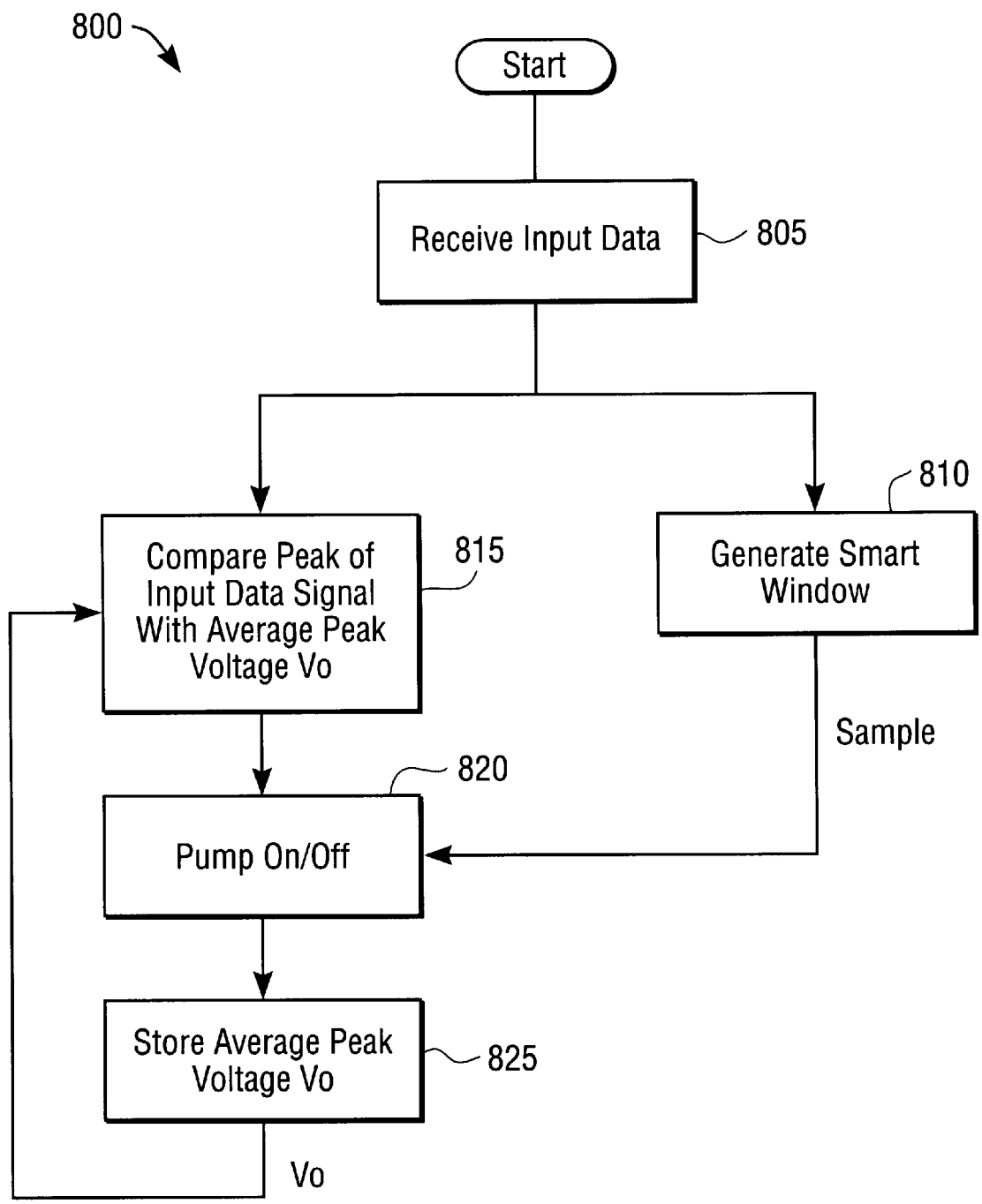
FIG. 8 is flowchart illustrating the operation of the peak detector of FIG. 2.

Referring now to FIG. 8, a flowchart 800 illustrates the operation of a peak detector in accordance with the present invention. An input data signal is first received 805 by the peak detector. Smart windows are generated 810 to define sampling intervals in the input data signal. The peak of the input data signal at the sampled interval is compared with an average peak voltage signal $V_O$ generated by the peak detector. Based upon the comparison 815 and the sampled window, the peak detector will pump up or pump down 820 the average peak voltage signal $V_0$. A capacitor in the peak detector stores 825 the average peak voltage signal $V_0$, and a comparison 815 may again be performed between the input data signal and the average peak voltage signal $V_0$.

What is claimed is:

1. A peak detector for generating a reference peak voltage signal, comprising:
- a comparator having a first input for receiving an input data signal, a second input for receiving the reference peak voltage signal, and an output for generating a comparing value signal based upon a comparison of the input data signal and the reference peak voltage signal;
- a sample and block circuit coupled to the output of the comparator and capable of sampling a portion of a pulse of the input data signal, the portion of the pulse of the input data signal being defined by a timing window received by the sample and block circuit, said sample and block circuit comprising:
  - a first transmission gate capable of receiving the timing window;
  - a second transmission gate coupled to the first transmission gate and capable of receiving the timing window;
  - a first transistor coupled to the first transmission gate and capable generating a first output control signal having a value dependent on values of the input data signal and the timing window; and
  - a second transistor coupled to the second transmission gate and capable of generating a second output control signal having a value dependent on values of the input data signal and the timing window;
- a charge pump coupled to the sample and block circuit and capable of setting a value of the reference peak voltage in response to the comparing value signal from the comparator, wherein the sample and block circuit transmits the comparing value signal from the comparator to the charge pump after receiving a timing window, and wherein the sample and block circuit blocks the transmission of the comparing value signal from the comparator to the charge pump in the absence of a timing window received by the sample and block circuit; and
- a timing window generator coupled to the sample and block circuit and capable of receiving the input data signal and generating a timing window in response to a pulse occurrence in the input data signal received by the timing window generator.

2. A peak detector for generating a reference peak voltage signal, comprising:
- a comparator having a first input for receiving an input data signal, a second input for receiving the reference peak voltage signal, and an output for generating a comparing value signal based upon a comparison of the input data signal and the reference peak voltage signal;
- a sample and block circuit coupled to the output of the comparator and capable of sampling a portion of a pulse of the input data signal, the portion of the pulse of the input data signal being defined by a timing window received by the sample and block circuit;
- a charge pump coupled to the sample and block circuit and capable of setting a value of the reference peak voltage in response to the comparing value signal from the comparator, wherein the sample and block circuit transmits the comparing value signal from the comparator to the charge pump after receiving a timing window, and wherein the sample and block circuit blocks the transmission of the comparing value signal from the comparator to the charge pump if a timing window is not received by the sample and block circuit; and
- a timing window generator coupled to the sample and block circuit and capable of receiving the input data signal and generating the timing window in response to a pulse occurrence in the input data signal received by the timing window generator, said timing window generator comprising:
  - a delay stage for receiving the input data signal;
  - an inverter coupled to the delay stage and capable of generating an inverted signal; and
  - an AND gate coupled to the inverter and capable of receiving the input data signal and the inverted signal to generate a timing window.

3. A peak detector for tracking a peak level of a data signal, comprising:
- a comparator having a first input for receiving the data signal, a second input for receiving a reference peak voltage signal from an output of the peak detector, and an output for generating a comparing value signal based upon a comparison between the data signal and the reference peak voltage signal;
- a sample and block circuit coupled to the output of the comparator, and comprising:
  - a first transmission gate capable of receiving the timing window;
  - a second transmission gate coupled to the first transmission gate and capable of receiving the timing window;
  - a first transistor coupled to the first transmission gate and capable generating a first output control signal having a value dependent on values of the input data signal and the timing windows; and
  - a second transistor coupled to the second transmission gate and capable of generating a second output control signal having a value dependent on values of the input data signal and the timing window;
- a charge pump coupled to the sample and block circuit and capable of setting a value of the reference peak voltage; and
- a timing window generator coupled to the sample and block circuit and capable of receiving the data signal and generating a timing window in response to a pulse occurrence in the data signal received by the timing window generator, said sample and block circuit transmitting the comparing value signal from the comparator to the charge pump in response to a timing window occurrence, and blocking the transmission of the comparing value signal from the comparator to the charge pump in response to an absence of a timing window.

4. A peak detector for tracking a peak level of a data signal, comprising:
- a comparator having a first input for receiving the data signal, a second input for receiving a reference peak voltage signal from an output of the peak detector, and an output for generating a comparing value signal based upon a comparison between the data signal and the reference peak voltage signal;
- a sample and block circuit coupled to the output of the comparator;
- a charge pump coupled to the sample and block circuit and capable of setting a value of the reference peak voltage; and a timing window generator coupled to the sample and block circuit and capable of receiving the data signal and generating a timing window in response to a pulse occurrence in the data signal received by the timing window generator, said timing window comprising:
a delay stage for receiving the input data signal;
an inverter coupled to the delay stage and capable of generating an inverted signal; and
an AND gate coupled to the inverter and capable of receiving t the input data signal and the inverted signal to generate a timing window;
said sample and block circuit transmitting the comparing value signal from the comparator to the charge pump in response to a timing window occurrence, and blocking the transmission of the comparing value signal from the comparator to the charge pump in response to an absence of a timing window.

5. A peak detector for generating a reference peak voltage signal, comprising:
a comparator having a first input for receiving an input data signal, a second input for receiving the reference peak voltage signal, and an output;
a sample and block circuit coupled to the output of the comparator and capable of sampling a portion of the input data signal, the portion of the input data signal being defined by a timing window received by the sample and block circuit;
a charge pump coupled to the sample and block circuit and capable of setting a value of the reference peak voltage based upon a control signal generated by the sample and block circuit; and
a timing window generator coupled to the sample and block circuit and capable of generating the timing window;
wherein the sample and block circuit comprises:
a first transmission gate capable of receiving the timing window;
a second transmission gate coupled to the first transmission gate and capable of receiving the timing window;
a first transistor coupled to the first transmission gate and capable generating a first output control signal having a value dependent on values of the input data signal and the timing window; and
a second transistor coupled to the second transmission gate and capable of generating a second output control signal having a value dependent on values of the input data signal and the timing window.

6. A peak detector for generating a reference peak voltage signal, comprising:
a comparator having a first input for receiving an input data signal, a second input for receiving the reference peak voltage signal, and an output;
a sample and block circuit coupled to the output of the comparator and capable of sampling a portion of the input data signal, the portion of the input data signal being defined by a timing window received by the sample and block circuit;
a charge pump coupled to the sample and block circuit and capable of setting a value of the reference peak voltage based upon a control signal generated by the sample and block circuit; and
a timing window generator coupled to the sample and block circuit and capable of generating the timing window;
wherein the timing window generator comprises:

a delay stage for receiving the input data signal;
an inverter coupled to the delay stage and capable of generating an inverted signal; and
an AND gate coupled to the inverter and capable of receiving the input data signal and the inverted signal to generate a timing window.

7. A peak detector for tracking a peak level of a data signal, comprising:
a comparator having a first input for receiving the data signal, a second input for receiving a reference peak voltage signal from an output of the peak detector, and an output for generating a comparing value signal based upon a comparison between the data signal and the reference peak voltage signal;
a sample and block circuit coupled to the output of the comparator;
a charge pump coupled to the sample and block circuit and capable of setting a value of the reference peak voltage; and
a timing window generator coupled to the sample and block circuit and capable of generating a timing window that permits the sample and block circuit to pass the comparing value signal to the charge pump, wherein the timing window is generated based upon the data signal;
wherein the sample and block circuit comprises:
a first transmission gate capable of receiving the timing window;
a second transmission gate coupled to the first transmission gate and capable of receiving the timing window;
a first transistor coupled to the first transmission gate and capable generating a first output control signal having a value dependent on values of the input data signal and the timing windows; and
a second transistor coupled to the second transmission gate and capable of generating a second output control signal having a value dependent on values of the input data signal and the timing window.

8. A peak detector for tracking a peak level of a data signal, comprising:
a comparator having a first input for receiving the data signal, a second input for receiving a reference peak voltage signal from an output of the peak detector, and an output for generating a comparing value signal based upon a comparison between the data signal and the reference peak voltage signal;
a sample and block circuit coupled to the output of the comparator;
a charge pump coupled to the sample and block circuit and capable of setting a value of the reference peak voltage; and
a timing window generator coupled to the sample and block circuit and capable of generating a timing window that permits the sample and block circuit to pass the comparing value signal to the charge pump, wherein the timing window is generated based upon the data signal;
wherein the timing window generator comprises:
a delay stage for receiving the input data signal;
an inverter coupled to the delay stage and capable of generating an inverted signal; and
an AND gate coupled to the inverter and capable of receiving the input data signal and the inverted signal to generate a timing window.

* * * * *